United States Patent [19]

Lim

[11] Patent Number: 5,537,242

[45] Date of Patent: Jul. 16, 1996

[54] LIQUID CRYSTAL MILLIMETER WAVE OPEN TRANSMISSION LINES MODULATORS

[75] Inventor: Khoon-Cheng Lim, Agoura, Calif.

[73] Assignee: Hughes Aircraft Company

[21] Appl. No.: 194,759

[22] Filed: Feb. 10, 1994

[51] Int. Cl.⁶ .................. G02F 1/11; G02F 1/13; G01T 1/20

[52] U.S. Cl. .................. 359/287; 359/46; 359/57; 359/94; 359/314; 250/201.9

[58] Field of Search .................. 359/46, 48, 94, 359/51, 287, 314; 250/201.9; 343/700 MS; 333/101, 156, 157, 161

[56] References Cited

U.S. PATENT DOCUMENTS

| | | | |
|---|---|---|---|
| 5,184,233 | 2/1993 | Lim et al. | 359/46 |
| 5,194,972 | 3/1993 | Lim et al. | 359/46 |
| 5,304,960 | 4/1994 | Das | 333/101 |
| 5,355,104 | 10/1994 | Wolfson et al. | 333/156 |
| 5,360,973 | 11/1994 | Webb | 359/565 |

OTHER PUBLICATIONS

K. C. Lim et al, "Liquid crystal millimeter wave electronic phase shifter", Applied Physics Letters, vol. 62(10), pp. 1065–1067 (8 Mar. 1993).

K. C. Lim and J. D. Margerum, "Liquid crystal optical properties and applications in the millimeter wave range", SPIE Proceedings, vol. 1815, pp. 99–105, Dec. 1992; and.

K. C. Lim et al, "Liquid crystal birefringence for millimeter wave radar", Liquid Crystals, vol. 14, No. 2, pp. 327–337 (1993).

J. Frey et al, "Microwave integrated circuits: an introduction", pp. xi–xvii, in Microwave Integrated Circuits, J. Frey et al, Artech House, Inc., Dedham (1985).

L. J. Lavedan, "Design of waveguide–to–microstrip transitions specially suited to millimetre–wave applications", pp. 81–82, in Microwave Integrated Circuits, J. Frey et al, Artech House, Inc., Dedham (1985).

G. T. Roome et al, "Thin ferrite devices for microwave integrated circuits", pp. 187–196, in Microwave Integrated Circuits, J. Frey et al, Artech House, Inc., Dedham (1985).

Primary Examiner—Rolf Hille
Assistant Examiner—Fetsum Abraham
Attorney, Agent, or Firm—V. D. Duraiswamy; W. K. Denson-Low

[57] ABSTRACT

Low-cost, thin-layer liquid crystal (LC) millimeter wave (MMW) phase modulators and phased array antennae are provided based on several types of open transmission stripline, parallel-line, and ridge-guide configurations in which surface-aligned LCs are modulated reversibly with small applied electrical fields. Incorporated properly in the open transmission lines, the LC layer can modulate the propagating MMW with nearly its full value of birefringence. The modulator comprises: (a) at least one transmission line supported on a first substrate; (b) a dielectric medium comprising a liquid crystal or a liquid crystal composite and contacting the substrate and the transmission line(s), the liquid crystal or a liquid crystal composite (e.g., polymer-dispersed liquid crystal; PDLC) having an electrically controllable dielectric permittivity; (c) a second substrate disposed opposite the first substrate and separated therefrom by a distance to accommodate the LC or LC composite; (d) means for sealing the LC or LC composite between the two substrates; (e) a source of millimeter waves electrically connected to the transmission line(s) for transmission therealong; and (f) means for varying the dielectric permittivity of the LC or LC composite to thereby modulate the transmission.

19 Claims, 6 Drawing Sheets

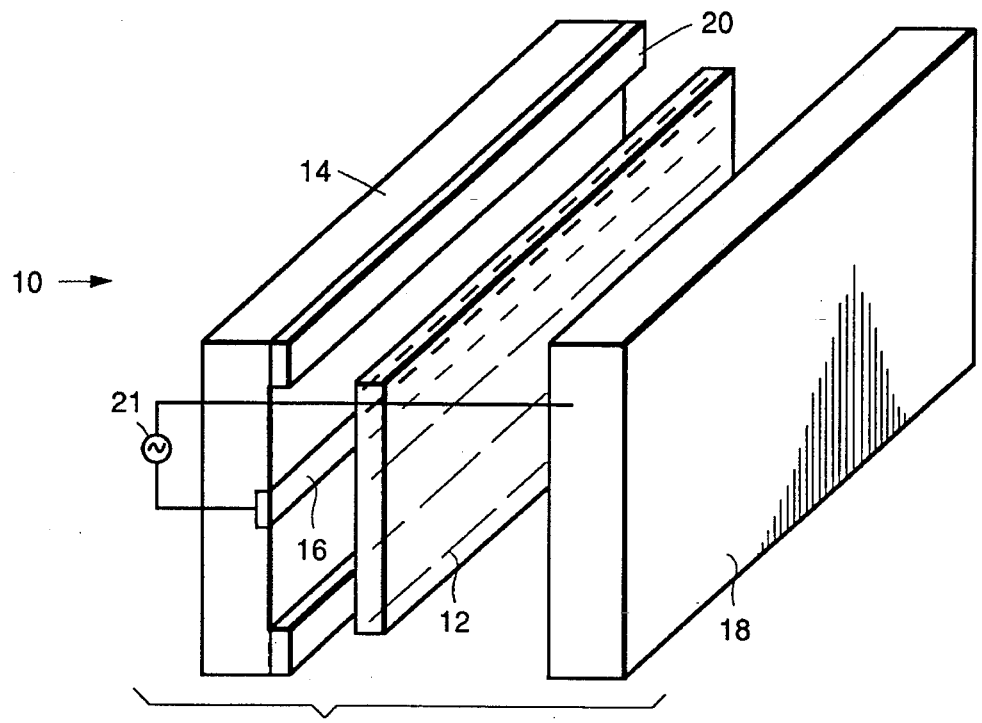
FIG. 1.
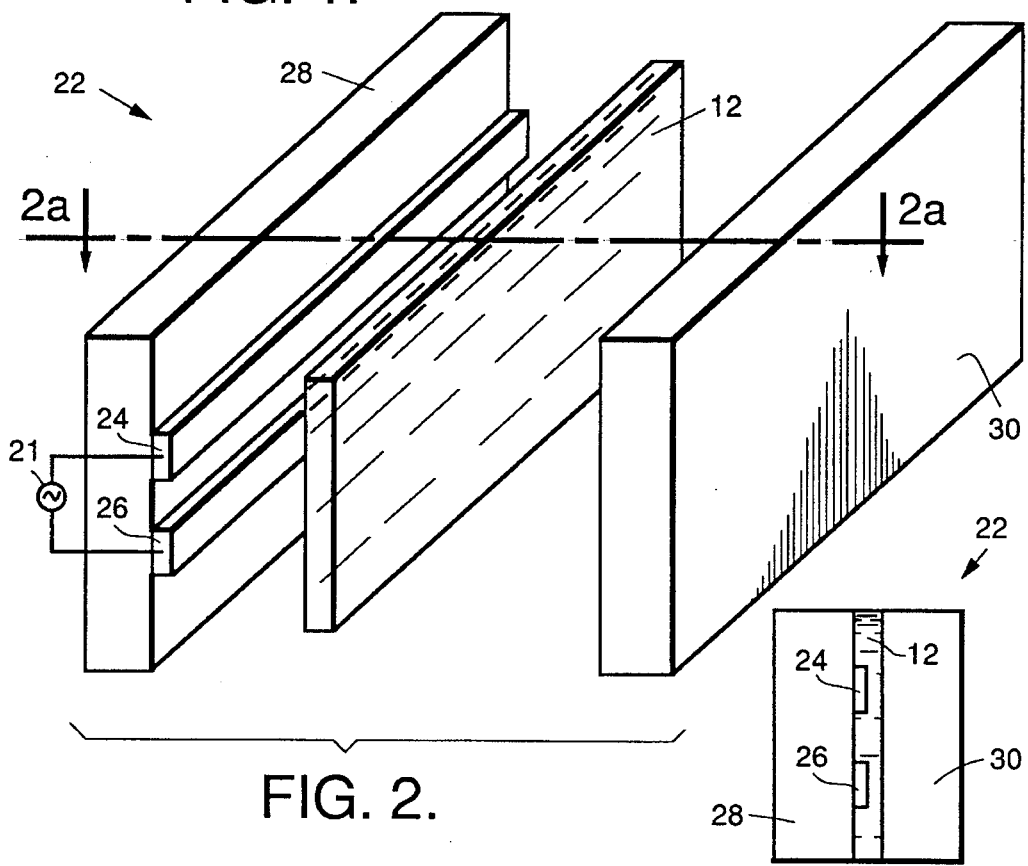
FIG. 2.
FIG. 2a.

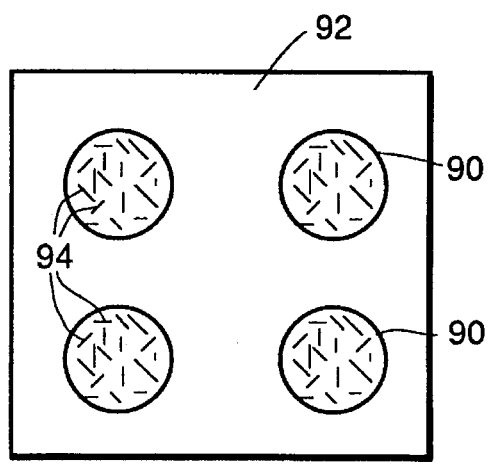
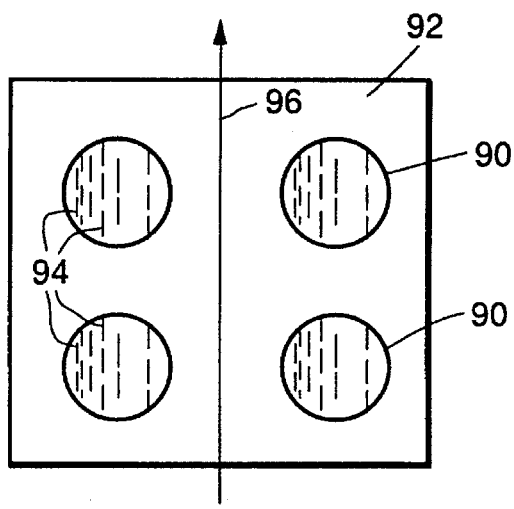
FIG. 10a.  FIG. 10b.
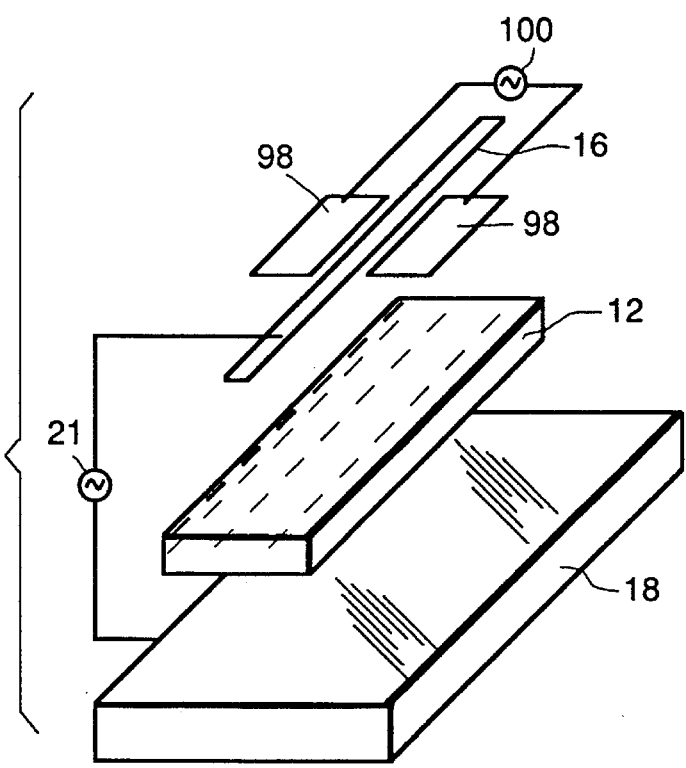
FIG. 11.

LIQUID CRYSTAL MILLIMETER WAVE OPEN TRANSMISSION LINES MODULATORS

BACKGROUND OF THE INVENTION

1. Field of the Invention

The present invention relates generally to millimeter wave (MMW) phase modulators, and, more particularly, to MMW phase modulators employing liquid crystals or liquid crystal composites, e.g., polymer-dispersed liquid crystals (PDLCs), as the modulating dielectric.

2. Description of Related Art

Low cost antenna systems, and integrated modulators in monolithic microwave integrated circuits (MMICs) are expected to grow at substantial rates. Examples of various applications are described below.

Low Cost Electronic Phased Array Antennas for Vehicles

Efforts are underway to develop low cost electronic-scanning phased array antennas for applications in land vehicles for navigation and crash avoidance purposes. For example, a 77 GHz mechanical scanning planar array antenna for automotive applications has been proposed. FCC regulations are expected to limit the radar operation band width. The present generation of electronic, e.g., diode-based, or magnetic field, e.g., ferrite-based, scanning antennae is extremely costly and bulky and these devices operate mostly below 20 GHz. There is no low cost system available at present, and investigations are proceeding in an effort to develop such systems.

MMW Environment Surveillance Antennas

There is a need for low cost, rugged, and compact electronic-scanning array antennas to be used as environment surveillance sensors in (1) airport runways, (2) home and factory alarm systems, (3) highways to monitor traffic, and (4) monitoring the weather and road conditions of the extended freeway system in the U.S. A unique advantage of MMW antennas is their effectiveness in adverse weather conditions.

Integrated Phase Shifter in MMICs

For purposes of reducing cost, fabrication effort, reliability, and mechanical integrity, discrete millimeter wave devices are being integrated and developed into MMICs. Phase shifters are key components in MMICs, and both the diode and ferrite phase shifters used presently incurred comparatively large loss, are power-consuming, and are costly to fabricate and integrate into the MMIC. Liquid crystal strip-line phase shifters are very compatible to MMICs; see, e.g., K. C. Lim et al, "Liquid crystal millimeter wave electronic phase shifter", *Applied Physics Letters*, Vol. 62(10), pp. 1065–1067 (8 Mar. 1993).

There are three principle antenna-scanning methods: mechanical scan, frequency scan, and electronic scan. Mechanical scanning antennas are bulky, costly, and require maintenance. Frequency scan is the simplest and easiest method; however, its wide-spread application is limited by FCC regulations due to its wide frequency band operation. The present generation of electronic (e.g., diode-based) or magnetic field (e.g., ferrite-based) scanning antennas are extremely costly, bulky, and operate mostly below 20 GHz.

Various versions of open transmission line modulating devices have been proposed, for example, microstrip-line on ferroelectric substrates. These devices typically have fast switching speeds, but suffer from (1) high loss at frequency above 30 GHz, (2) limited frequency range operation (operation limited to below 100 GHz due to deteriorating electromagnetic properties at high frequency), (3) high power and high current operation, and (4) high cost.

There are no low cost MMW modulation devices, such as electronic phase shifters and electronic scanning array antennas, currently available.

There are some ferrite-based scanning array antenna designs, but these are not deemed suitable for development into low cost devices, for the reason given above.

Existing MMW phase modulators and phased array antennas are very expensive. Prior liquid crystal (LC) MMW modulator patents and studies were based on conventional metal waveguides and required relatively large volumes of LC. Examples of such patents include "Microwave Phase Modulation with Liquid Crystals", U.S Pat. No. 5,194,972, issued Mar. 16, 1993, and "Liquid Crystal Based Composite Material Having Enhanced Microwave Birefringence", U.S. Pat. No. 5,184,233, issued Feb. 2, 1993.

Thus, there remains a need for low-cost liquid crystal MMW phase modulators and phase array antenna designs that employ relatively small quantities of liquid crystal material.

SUMMARY OF THE INVENTION

In accordance with the present invention, low-cost, thin-layer liquid crystal (LC) or polymer-dispersed liquid crystal (PDLC) MMW phase modulators and phased array antenna designs are provided based on several types of open transmission strip-line, parallel-line, and ridge-guide configurations in which surface-aligned LCs are modulated reversibly with small applied electrical fields. As used herein, the terms "liquid crystal medium" or "LC" may refer to either a liquid crystal layer, comprising one or more liquid crystal compounds, or a liquid crystal composite, comprising at least one liquid crystal compound dispersed in a polymer matrix.

Incorporated properly in the open transmission lines, a thin layer of a liquid crystal medium can modulate the propagating MMW with nearly its full value of birefringence.

The open transmission lines modulator of the present invention comprises:

(a) at least one transmission line supported on a first substrate;

(b) a dielectric medium disposed adjacent the substrate and the transmission line(s), the dielectric medium comprising a liquid crystal or PDLC having an electrically controllable dielectric permittivity;

(c) a second substrate disposed opposite the first substrate and separated therefrom by a distance to accommodate the liquid crystal or PDLC;

(d) means for sealing the liquid crystal or PDLC between the two substrates;

(e) a source of millimeter waves electrically connected to the transmission line(s) for transmission therealong; and (f) means such as externally-applied electric or magnetic fields for varying the dielectric permittivity of the liquid crystal to thereby modulate the transmission.

A metal ground plane may be incorporated on the second substrate when required. The inner surfaces of the substrates and metal ground plane may be surface-treated to impose surface-induced alignment to the liquid crystal or PDLC layer.

The new thin layer LC strip-line designs require small volumes of liquid crystal medium, and the devices are made with conventional metallization, lithography, LC surface alignment, and cell-sealing techniques which are suitable for low cost mass production. The strip-line design also facilitates simpler application of external modulation of the electric field. In the case of PDLC, the switching speeds are expected to be fast, within the range of about 1 ms.

These new open transmission lines LC modulators can be integrated in semiconductor MMIC systems as compact, low-cost modulators.

BRIEF DESCRIPTION OF THE DRAWINGS

FIG. 1 is an exploded view in perspective of a LC strip-line phase shifter of the present invention;

FIG. 2 is an exploded view in perspective of a LC parallel transmission lines phase shifter of the present invention;

FIG. 2a is a cross-sectional view of the assembled phase shifter shown in FIG. 2, taken along the line 2—2;

FIGS. 10a and 10b are each a schematic view of an example of a liquid crystal composite (PDLC), with random alignment of the liquid crystal director in the absence of an external applied electric field (FIG. 10a) and in the presence of an external applied electric field (FIG. 10b); and FIG. 11 is an exploded view of a strip-line phase shifter with an extra set of external electrodes to modulate the liquid crystal orientation.

DESCRIPTION OF THE PREFERRED EMBODIMENTS

Figure 3:
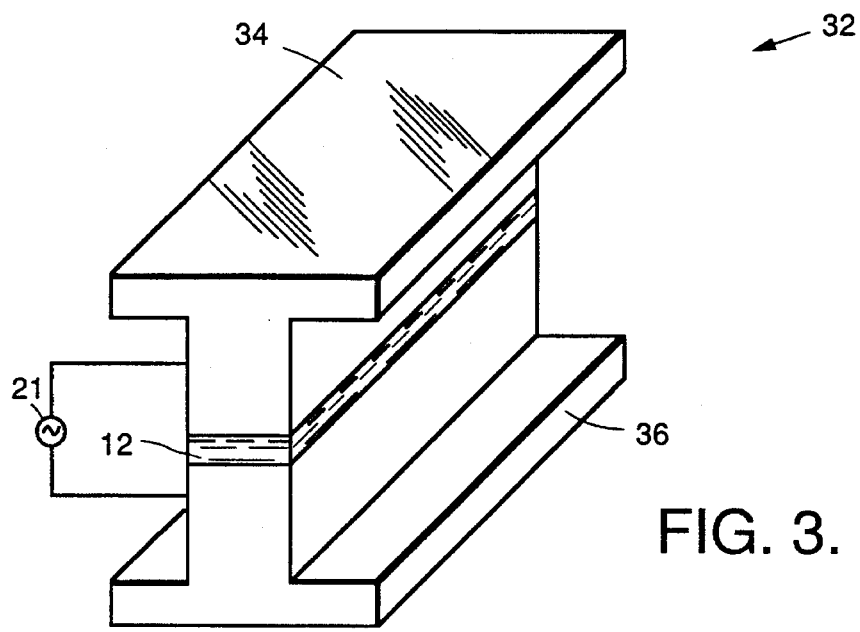
FIG. 3 is an exploded view in perspective of a LC ridge waveguide phase shifter of the present invention.

Three representative LC open transmission line phase modulation devices, strip-line phase shifter, parallel transmission lines phase shifter, and ridge waveguide phase shifter, are respectively shown in FIGS. 1–3. In all of the designs, a thin surface-aligned LC layer or PDLC layer is sandwiched between the substrates. Depending on the configuration of the transmission line(s), the two substrates both comprise dielectric materials (single strip transmission line) or one comprises a dielectric material and the other is a metal ground plane (at least two strip transmission lines) or both comprise metal (ridge waveguide structure). The effective dielectric constant of the LC layer is modulated by applying a low frequency (~1 KHz) voltage across the transmission line and metal ground plane (single strip transmission line) or across the transmission lines (at least two strip transmission lines) or across the metal substrates (ridge waveguide structure). In all of the designs disclosed herein, a source of millimeter waves is electrically connected to the transmission line(s). The millimeter waves propagate in the transmission line. The millimeter waves are coupled into the transmission line via conventional coupling techniques. Such coupling techniques are well-known and do not form a part of the present invention. In each case, the transmission line(s) and/or substrate(s) act also as the electrodes (see FIG. 1 and FIG. 11). DC blocks are used in the transmission line to isolate the applied voltage from the MMW source and detector. The operating voltage is in the range of 10 to 100 V.

Open transmission lines, such as strip-lines, parallel transmission lines, and the like, are surrounded by free space which can be substituted with a dielectric medium. In accordance with the present invention, a liquid crystal or its composites acts as the dielectric medium.

In the case of the strip-line phase shifter, the millimeter waves are transmitted along the strip-line. The MMW electro-magnetic field is confined mainly between the strip-line and the ground plane. As described above, the LC strip-line phase shifter of the present invention can be easily integrated into MMICs. A metal wave-guide to strip-line transition is shown by L. J. Lavedan, "Design of waveguide-to-microstrip transitions specially suited to millimeter-wave applications", pp. 81–82, in *Microwave Integrated Circuits*, J. Frey et al, Artech House, Inc., Dedham (1985).

FIG. 1 depicts a LC strip-line phase shifter 10. The LC layer 12 is sandwiched between the dielectric substrate 14 that carries the strip-line 16 and the metallic ground plane 18. Spacers 20 provide sealing of the liquid crystal cell around the perimeter of the substrate 14 and ground plane 18. The inner surfaces of the substrate 14 and ground plane 18 are treated to induce surface alignment on the LC layer. Such surface-alignment procedures are well-known and do not form a part of the present invention.

The propagation constant of the transmission line(s) can be modulated by varying the effective dielectric constant of the liquid crystal medium. LCs can be incorporated near to the transmission lines as varying dielectric constant media to modulate the propagation constant. Modulation means 21 is used to modulate the molecular orientation of the liquid crystal layer 12, which varies the effective dielectric constant of the liquid crystal medium. Such modulation means are well-known.

Methods of LC incorporation and additional LC MMW devices are described in the following paragraphs.

FIG. 2 depicts a LC parallel transmission lines phase shifter 22. The LC 12 and the two thin metallic parallel transmission lines 24, 26 are sandwiched between two solid dielectric substrates 28, 30. The inner surfaces of the substrates are treated with an aligning agent to surface-align the LC.

FIG. 3 depicts a LC ridge waveguide phase shifter 32. The LC layer 12 is sandwiched between two metal ridge guides 34, 36. The LC layer 12 is about 10 μm thick, and is aligned by the ridge guide's inner surfaces, which are treated with a surface-aligning agent. If a PDLC layer is employed in place of the LC layer 12, the layer thickness can be as thick as about 300 μm, which would reduce conduction loss.

In operating any of the foregoing described devices, when the microstrip line (transmission line 16 in FIG. 1, parallel transmission lines 24, 26 in FIGS. 2 and 2a, and ridge guides 34, 36 in FIG. 3) is actuated by a microwave signal, the associated electric field $E_{rf}$ which propagates in the structure is essentially vertically polarized and mainly confined in the liquid crystal film 12. In this case, the field $E_{rf}$ is orthogonal to the molecules' main axis and experiences a dielectric permittivity $\epsilon_\perp$. On the other hand, the liquid crystal molecules which act as di-poles can be rotated by 90° when a constant electric field $E_0$ is applied between the microstrip line and the ground plane (or other microstrip line). In this case, the molecules' main axis becomes parallel to the direction of the field $E_{rf}$ and the experienced dielectric permittivity becomes $\epsilon_\parallel$. In operation, the microwave signal and the bias voltage are simultaneously applied on the microstrip line. For an intermediate value E of the control field ($0 \leq E \leq E_0$), the permittivity is $\epsilon(E)$ ($\epsilon_\perp \leq \epsilon(E) \leq \epsilon_\parallel$). Therefore, it provides an analog control of the constant of propagation of the microwave signal in the microstrip line and a phase shift proportional to the applied bias voltage can be obtained.

In the above teaching, the liquid crystal layer can be replaced by a layer of liquid crystal composite (e.g., PDLC) and all operation remains the same. The advantages of using PDLC are that (1) it eliminates the necessity of using surface alignment of liquid crystal, (2) it increases the switching speeds, and (3) it simplifies the encapsulation of liquid crystal layer; the PDLC layer is solid and self-supporting.

To increase dielectric constant change in modulation, PDLC liquid crystal droplets can be pre-aligned during formation (polymerization) of PDLC.

Experimental Data of a Prototype Strip-line Phase Shifter

To demonstrate the concept of the present invention, an electronic millimeter wave strip-line phase shifter using a liquid crystal to modulate the propagation constant was demonstrated experimentally. The schematic design of the strip-line phase shifter was as depicted in FIG. 1. A gold strip-line 16, of width about 0.1 cm and length 7.5 cm, was vacuum-deposited on a microscopic slide which served as the dielectric substrate 14. An aluminum plate acted as the ground plane 18 and a 1 mil mylar spacer 20 separated the dielectric substrate 14 from the ground plane.

Both inside surfaces of the glass slide and aluminum plate were surface-coated with polyvinyl alcohol (PVA) to facilitate surface-induced alignment on the LC (BDH-E7) layer 12. The liquid crystal material, whose molecular orientation was modulated by an external electric field, was used as an effectively varying dielectric constant substrate between the strip-line and the ground plane.

Figure 4:
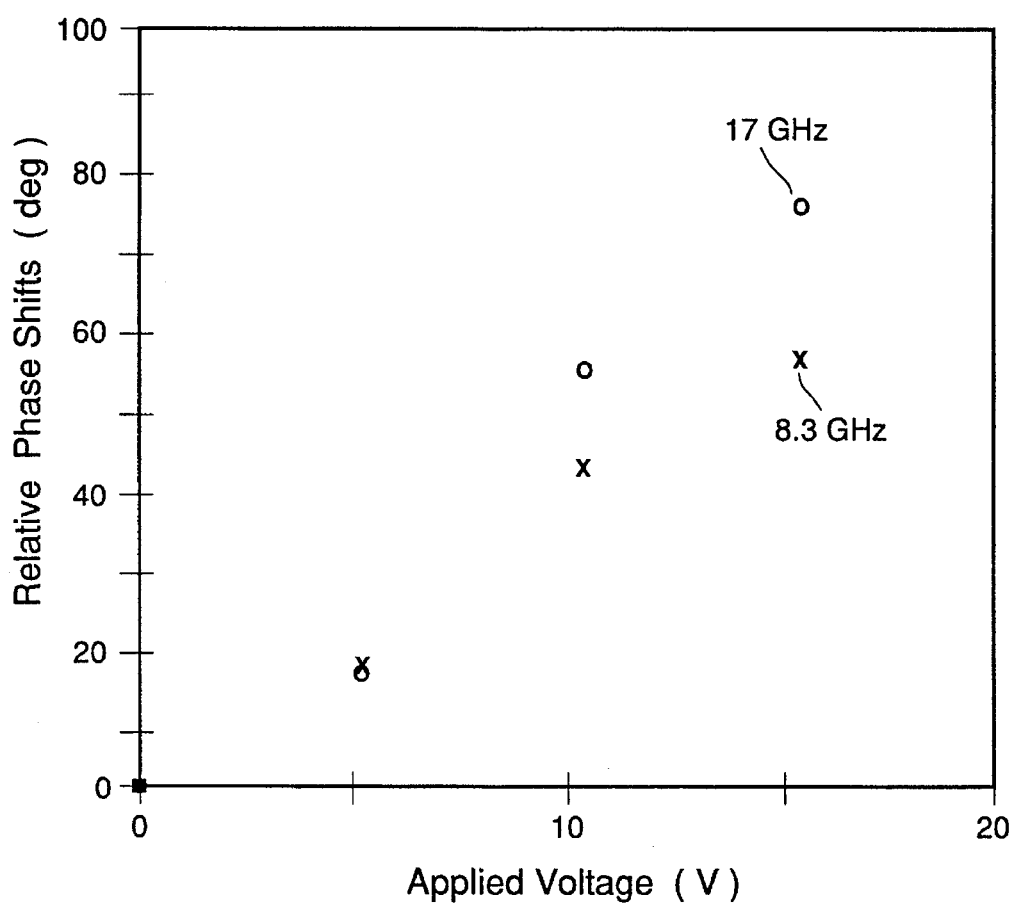
FIG. 4, on coordinates of relative phase shift (in degrees) and applied voltage (in volts) is a plot of phase shifts at 8.3 GHz and 17 GHz as a function of applied voltage of a strip-line phase shifter of the present invention.

The phase shifts as a function of the applied voltage were measured with a Wiltron network analyzer from 5 GHz to 25 GHz. FIG. 4 shows the measured phase shifts as a function of the applied voltage at 8.3 GHz and 17 GHz. There were no hystereses in increasing and decreasing the voltages. An insertion loss of about 10 to 15 db was observed for this laboratory device, as no attempt was made to reduce loss at the coaxial to strip-line coupling.

Applications of Open Transmission Line LC Modulators

The LC strip-line, parallel transmission line and the ridge waveguide phase shifters can be used in a variety of new and novel MMW modulation devices. Described in the following paragraphs are some representative methods of application of LC in MMW devices. All device designs show very simple methods of incorporation and operation of the LC modulation medium.

MMIC LC Phase Modulator

LC strip-line phase modulators are compatible to MMIC systems and can be incorporated in MMICs with appropriate modifications. Most MMIC transmission lines comprise one or more strip-lines on semiconductor, e.g., Si, wafer substrates. LC layers used for modulation can be surface-aligned with polyimides, which are commonly used to passivate the semiconducting devices. LCs are non-corrosive and electrically non-conducting.

Strip-line Phased Array Antenna

Figure 5:
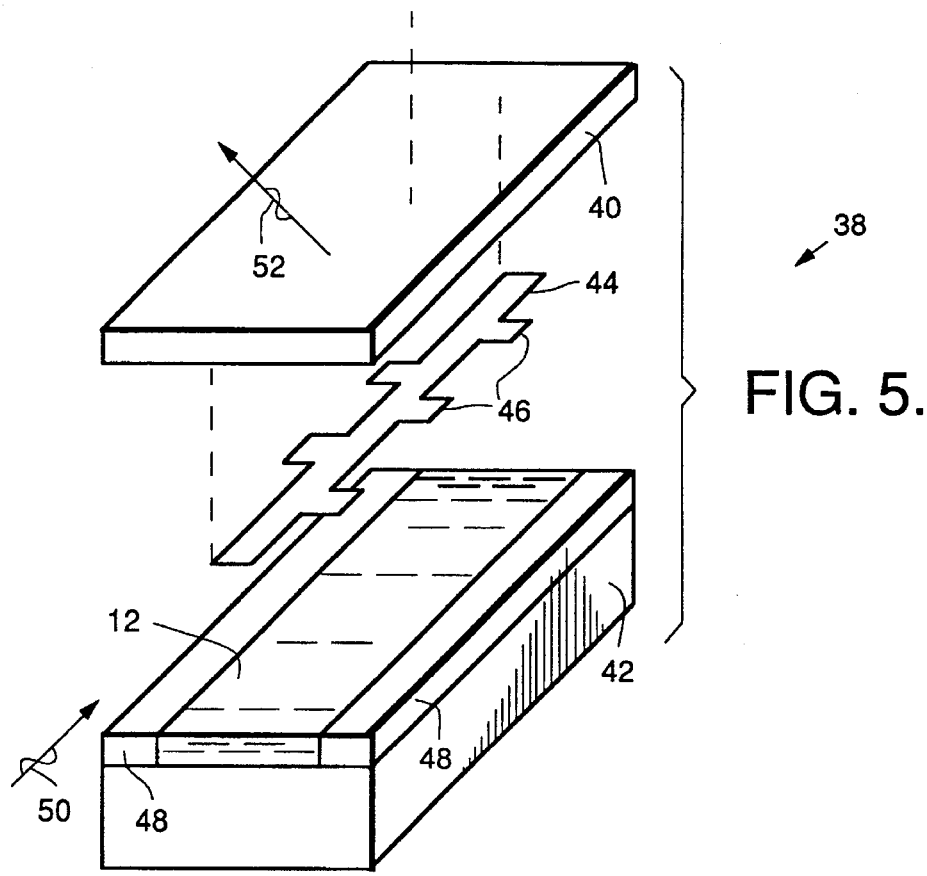
FIG. 5 is an exploded view in perspective of a LC strip-line linear array antenna of the present invention.

FIG. 5 depicts a LC strip-line linear array antenna 38. The LC 12 is surface-aligned by the inner surfaces of the top dielectric 40 and bottom metal ground plane 42 substrates. The strip-line transmission line 44 includes an array of radiating patches 46. The thickness of the cell-sealing spacers 48 is about 10 μm. The incoming MMW is shown by arrow 50; the radiating MMW is shown by arrow 52. As described above, the source of millimeter waves is electrically connected to the transmission line, in this case, the strip-line transmission line 44.

The propagation of the MMW in the strip-line transmission line 44 is perturbed by the metal patches 46 which cause the MMW to be coupled out of the strip-line transmission line and to radiate into free space around the metal patches. The radiating MMW is transmitted through the top dielectric 40 which is transparent to MMW radiation.

By attaching the array of metal perturbing patches 46 onto or near to the strip-lines 44, the metal patches act as a linear-phased array antenna. The patch periodicity depends on the angle of radiation desired, as is well-known. For a LC layer thickness ranging from 5 to 25 μm thick, the LC can be surface-aligned. However, at such a thickness, it is much smaller than the λ/4 or even λ/32 required for efficient radiation; such antenna can only be used for short-range modest output power applications. External AC (about 1 KHz) voltage applied across the strip-line and the ground plane modulates the effective dielectric constant of the LC layer. The radiating beam direction is accordingly modulated.

An attractive feature of the strip-line array antenna rests in the operation of LC modulation medium. It can be incorporated into the strip-line geometry without any major modification and can be fabricated at extremely low cost.

Patch-phased Array Antennas Using LC Strip-line Phase Modulator Array Module A planar phased array antenna can be fabricated at low cost by combining a patch antenna with a LC strip-line phase modulator array module.

Figure 6:
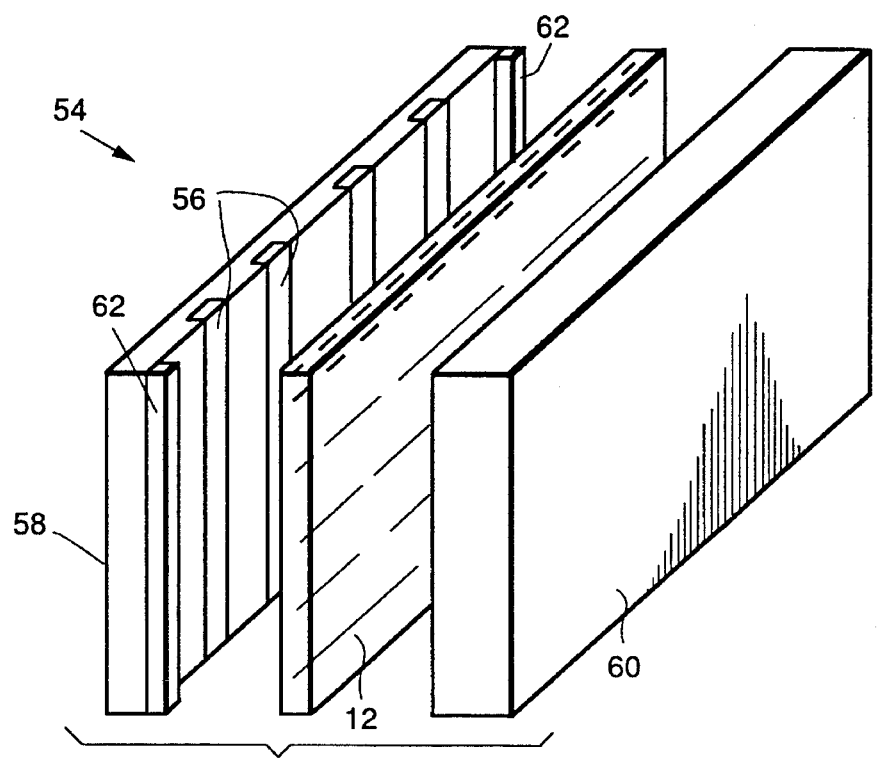
FIG. 6 is an exploded view in perspective of a LC strip-line phase modulator array module in which the LC layer is surface-aligned.

As shown in FIG. 6, LC strip-line phase modulators 54 can be fabricated in array-module form by laying many strip-lines 56 on the same dielectric substrate 58 and spaced far apart to reduce interference between neighboring lines. The module can be assembled by sandwiching a LC layer 12 between the substrate 58 and a common ground plane 60, employing spacers 62.

Figure 7:
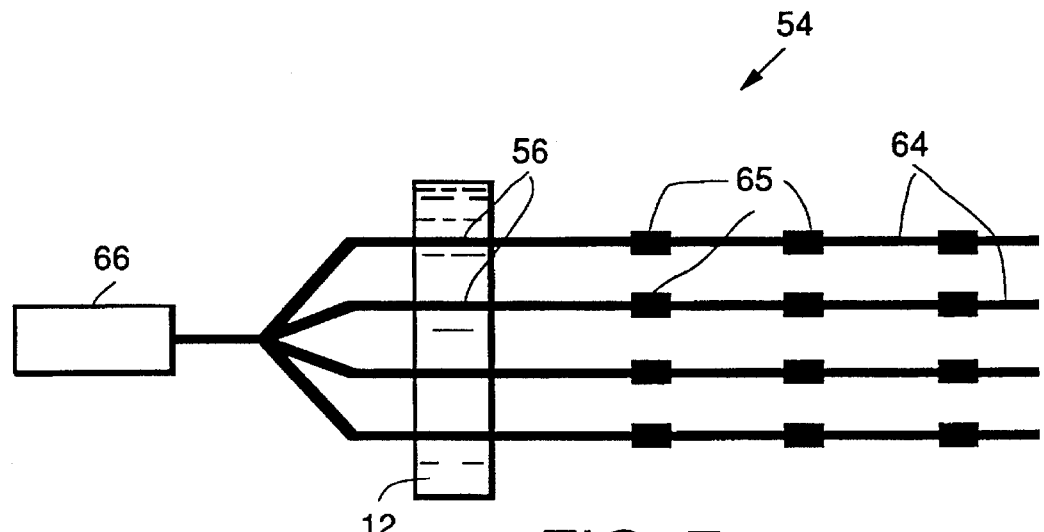
FIG. 7 is a schematic diagram of an electronic-scanning patch-phased array antenna using LC phase modulator array module to modulate the phases of the radiating elements.

The module can be used in conjunction with a planar array antenna, e.g., patch-phased array antenna, to act as an electronic-scanning array antenna. The schematic of a patch-phased array antenna 64 using a LC phase modulator module 54 is shown in FIG. 7. The patch-phased array antenna 64 includes metal radiating pads 65, spaced a predetermined distance along the antenna 64. As with the patches discussed above, the pad periodicity is related to the desired angle of radiation.

Power from the MMW power source 66, e.g., Gunn oscillator, is divided into the strip-lines. The liquid crystal phase shifters then phase-modulate the MMW and the phase-modulated millimeter waves are radiated from the patch antenna radiating pads 65. The angle of the radiating MMW beam is controlled by the relative phase shifts in each phase shifter.

Ridge Waveguide Linear Array Antenna

Figure 8:
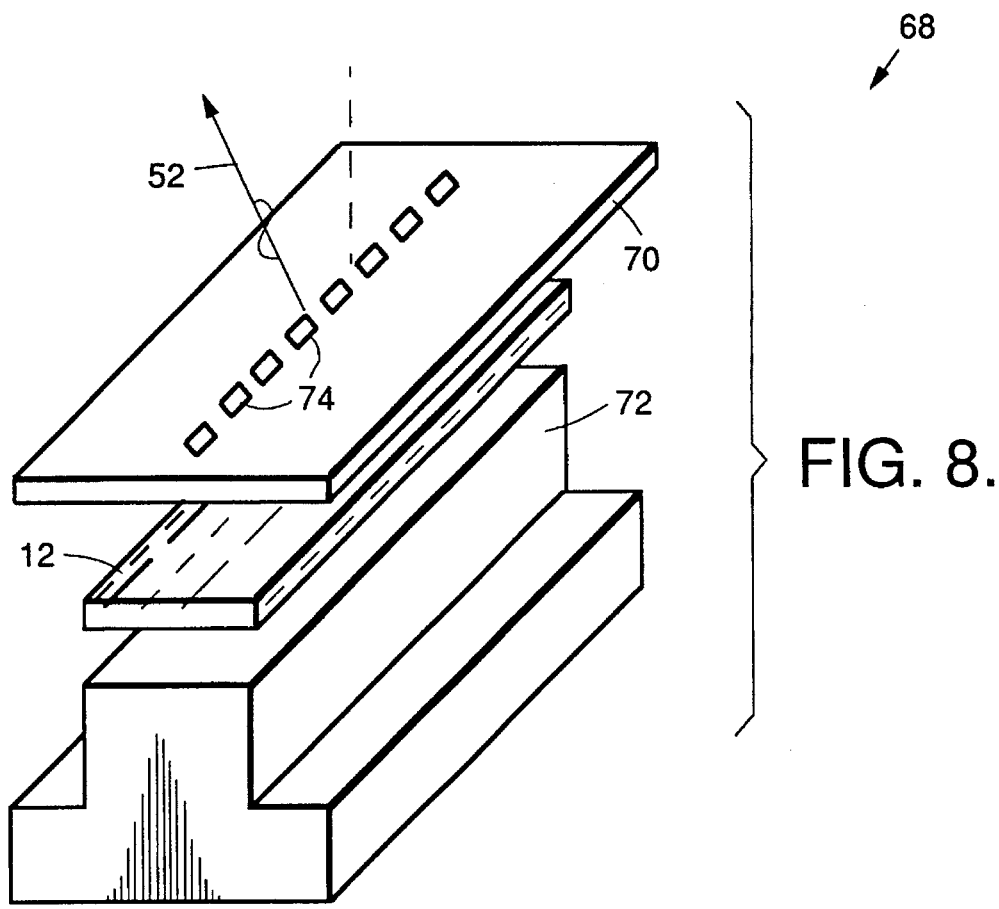
FIG. 8 is an exploded view in perspective of a LC ridge waveguide phase shifter in which the thin LC layer is surface-aligned.

Ridge waveguide can be used to avoid unnecessary stray radiation of strip-line at high frequencies. A schematic of a LC ridge waveguide linear array antenna 68 is shown in FIG. 8. The thin layer 12 of LC is surface-aligned, and its orientation is modulated by applying an external voltage (typically 1 KHz AC) across the metal guides 70, 72.

One side of the metal guide is modified into a flat plate 70 and array(s) of slots 74, acts as radiating elements, are cut parallel to the transmission axis of the plate. Design details of the slots 74 will not be discussed here, as they are well-known in textbooks. The guide wavelength of the propagating MMW is modulated by applying across the metal guides 70, 72 an external voltage that modulates the effective dielectric constant of the LC. The radiating efficiency of this antenna is less sensitive to the LC layer thickness, and hence, its output power can be higher.

LC Parallel Transmission Line-Phased Array Antenna

Figure 9:
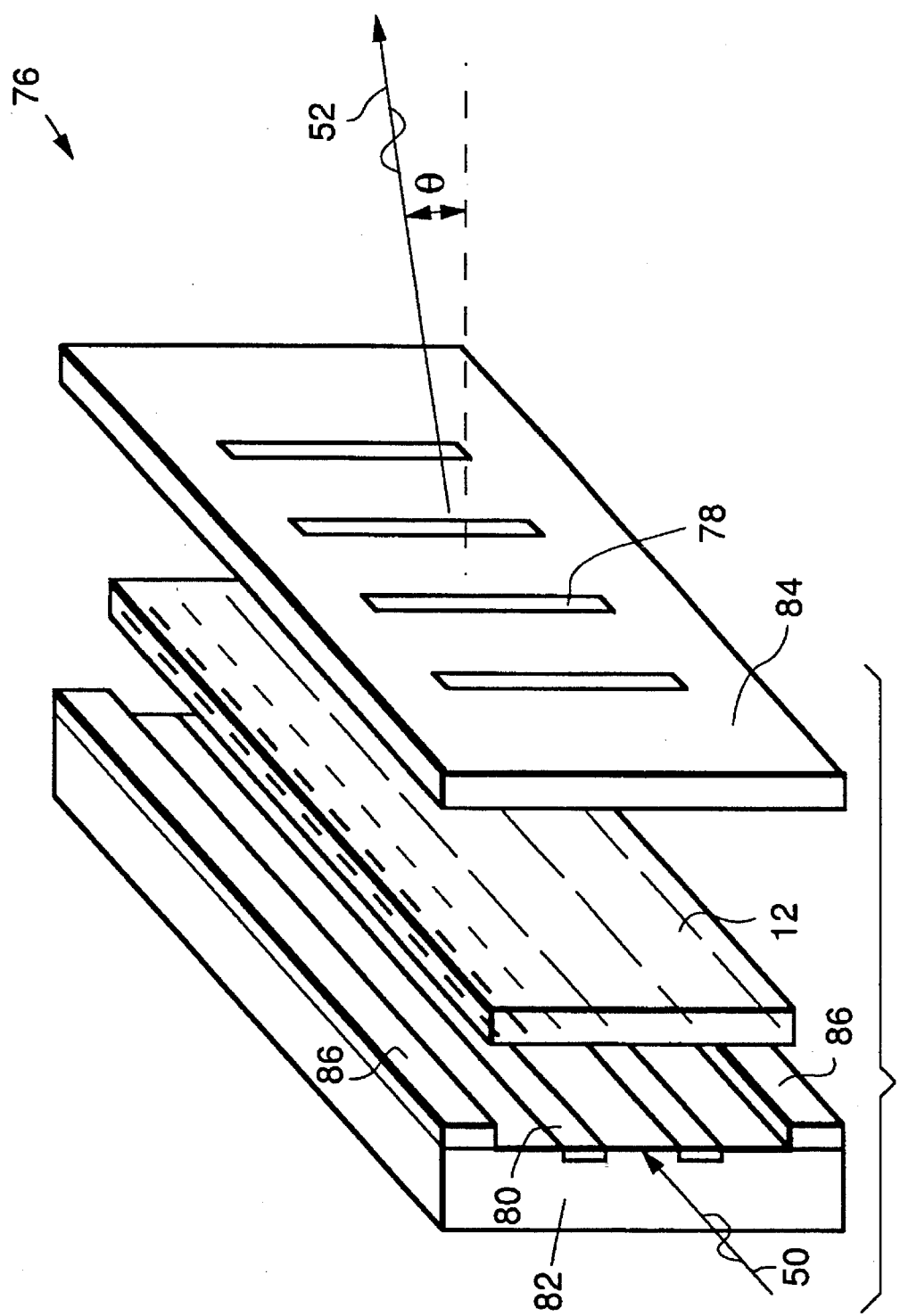
FIG. 9 is an exploded view in perspective of a novel parallel transmission line LC electronic scanning-phased array antenna of the present invention.

FIG. 9 shows a schematic diagram of a parallel transmission line linear array antenna 76. A set of parallel metal strips 78 placed across and at a small distance above the parallel transmission lines 80, act as a linear radiating array element. The parallel transmission lines 80 are supported on the interior surface of a dielectric substrate 82, while the linear radiating array element 78 is placed on the exterior surface of a thin dielectric substrate 84. Spacers 86 separate the two substrates 82, 84. The size of the metal strips 78, the distance above the transmission lines 80, and the spacing of the array of the metal strips determine quality and the performance of the scanning beam.

This antenna design facilitates the mass production of the antenna. As an estimate, it can be fabricated for about $2/antenna (1993 dollars). It is especially suitable for applications as an environmental sensor and an automobile obstacle sensor where high power and high precision radiating beams are not critical.

Low cost MMW modulators of the invention may be used as (1) phase shifters for phased array antennas; (2) phase shifters integrated into MMIC; and (3) non-linear phase shifters.

The advantages of such low cost MMW modulators include:

1. cost advantage, specifically, extremely low unit cost (<$10/unit in 1993 dollars).

2. switching operation advantages, including low operating voltage, use of dc or low-frequency ac voltage, low power consumption, and simple electronic switching circuits.

3. manufacturing advantages, including easy and simple fabrication, low manufacturing cost, low tooling cost, and suitability for mass production.

4. device advantages, reciprocal sending/receiving modulation, compatible to open transmission lines, compatible to MMIC technology, low dielectric constant (~4), hence low insertion loss, comparatively low loss (compare to ferro-electric, etc., materials), LC material as modulation medium is expected to be applicable over the frequency range of 1 to 1,000 GHz, operating parameters not very sensitive to temperature change (within a range of about 20° C.), wide operating temperature range (with heater, −20° C. to +100° C.; without heater, 5° C. to 35° C.), mechanically robust, very compact in size, and conforms to structure.

In the above application of LC strip-line phase shifter in various modulation devices, the liquid crystal layer 12, which can comprise one or more liquid crystals, can be replaced with a liquid crystal composite, such as a PDLC.

A PDLC is a polymer and liquid crystal composite comprising micrometer-sized liquid crystal droplets embedded in a polymer matrix. The PDLC can be made by polymerization of a mixture of polymer monomers and liquid crystal molecules; after polymerization, the polymer monomers form a network of polymer matrix while the liquid crystal phase is separated into tiny droplets randomly embedded in the polymer matrix.

FIG. 10a depicts a plurality of liquid crystal droplets 90 embedded in a polymer matrix 92. The liquid crystal directors 94 are randomly aligned. FIG. 10b depicts the same structure as FIG. 10a, but with the application of an external applied electric field, denoted by arrow 96. The liquid crystal directors 94 are seen to be aligned parallel to the electric field.

Finally, an external set of modulating metal electrodes may be used to assist in modulating the liquid crystal or PDLC orientation. FIG. 11 is an exploded view of a strip-line phase shifter with such an extra set of external modulating electrodes 98. The external modulating electrodes are modulated by a separate external applied electric field 100. The use of an additional external set of modulating electrodes 98 can be employed in other variations of the modulator of the present invention.

The liquid crystal medium employed in the present invention may comprise any liquid crystal material whose molecules align in response to an applied magnetic or electric field, including nematic and smectic liquid crystal compositions. Especially preferred are highly conjugated, rod-like, type molecular structures, such as structures containing biphenyl, terphenyl, phenylpyrimidine, biphenylpyrimidine, toane, and diphenyldiacetylene groups. Other types of liquid crystal structures, including Schiff bases, azoxybenzenes, and aromatic esters may also be employed.

Thus, there has been disclosed liquid crystal millimeter wave open transmission lines modulators. It will be readily apparent to those skilled in this art that various changes and modifications of an obvious nature may be made, and all such changes and modifications are considered to fall within the scope of the invention as defined by the appended claims.

What is claimed is:

1. An open transmission lines modulator for millimeter wavelength transmission comprising:

(a) at least one transmission line supported on a first substrate;

(b) a dielectric medium contacting said substrate and said at least one transmission line, said dielectric medium comprising a liquid crystal medium having an electrically controllable dielectric permittivity;

(c) a second substrate disposed opposite said first substrate and separated therefrom by a distance to accommodate said liquid crystal as a film therebetween;

(d) means for sealing said liquid crystal between said two substrates;

(e) a source of millimeter waves electrically connected to said at least one transmission line for transmission therealong; and (f) first means for varying said dielectric permittivity of said liquid crystal to thereby permit continuous variation of modulation of said transmission.

2. The modulator of claim 1 wherein said liquid crystal medium comprises at least one liquid crystal compound.

3. The modulator of claim 1 wherein said liquid crystal medium comprises a liquid crystal composite comprising at least one liquid crystal compound dispersed in a polymer matrix.

4. The modulator of claim 1 wherein said first substrate comprises a dielectric material and said second substrate comprises a metal to form a ground plane.

5. The modulator of claim 4 wherein said at least one transmission line comprises a single transmission line.

6. The modulator of claim 4 wherein said at least one transmission line comprises a single strip transmission line to which a plurality of radiating patches is attached.

7. The modulator of claim 4 wherein said at least one transmission line comprises a plurality of spaced, parallel transmission lines.

8. The modulator of claim 7 wherein each said transmission line is connected to an antenna to form a planar array antenna.

9. The modulator of claim 8 wherein each antenna includes a plurality of patches, spaced apart by a predetermined distance.

10. The modulator of claim 1 wherein said first substrate and said second substrate each comprise a dielectric material.

11. The modulator of claim 10 wherein said first substrate supports two parallel transmission lines to transmit millimeter waves.

12. The modulator of claim 11 wherein said second substrate has a plurality of metal strips at 90° to said transmission lines to provide a radiating array.

13. The modulator of claim 10 wherein said first substrate supports a plurality of spaced, sets of parallel transmission lines to transmit millimeter waves.

14. The modulator of claim 1 wherein two metal blocks spaced evenly apart by said liquid crystal medium form a pair of ridge waveguide transmission lines for transmitting millimeter waves.

15. The modulator of claim 1 comprising a first metal block forming a ridge waveguide transmission line and a second metal planar substrate spaced evenly apart from said first metal block by said liquid crystal medium, said metal planar substrate provided with a plurality of radiating slots parallel to said transmission direction, with said modulating electric field applied across the two metal substrates.

16. The modulator of claim 1 further including second means for applying an external modulating electric field across said liquid crystal medium.

17. The modulator of claim 1 wherein said film of liquid crystal ranges from about 5 to 300 μm in thickness.

18. The modulator of claim 1 wherein said first means for varying said dielectric permittivity of said liquid crystal comprises a low frequency a.c. voltage source operating at about 10 to 100 volts.

19. The modulator of claim 18 wherein said low frequency is about 1 KHz.

\* \* \* \* \*